US00RE39766E

(19) United States
(12) Reissued Patent
Cheng

(10) Patent Number: US RE39,766 E
(45) Date of Reissued Patent: Aug. 14, 2007

(54) MULTI-LAYER CIRCUIT BOARD

(75) Inventor: Yu-Chiang Cheng, Taipei (TW)

(73) Assignee: Mitac Technology Corp., Hsin-Chu Hsien (TW)

(21) Appl. No.: 10/943,256

(22) Filed: Sep. 15, 2004

Related U.S. Patent Documents

Reissue of:
(64) Patent No.: 6,489,570
Issued: Dec. 3, 2002
Appl. No.: 09/800,215
Filed: Mar. 6, 2001

(51) Int. Cl.
*H05K 1/03* (2006.01)

(52) U.S. Cl. ..... 174/255; 361/792
(58) Field of Classification Search ..... 174/255, 174/260, 262; 361/760, 792, 793, 794, 795
See application file for complete search history.

(56) References Cited

U.S. PATENT DOCUMENTS 4,285,780 A * 8/1981 Schachter ..... 205/120
4,380,704 A * 4/1983 Wisda ..... 307/116
4,526,835 A * 7/1985 Takahashi et al. ..... 156/248
4,675,789 A * 6/1987 Kuwabara et al. ..... 361/794
5,010,641 A * 4/1991 Sisler ..... 29/830
5,400,039 A * 3/1995 Araki et al. ..... 343/700 MS
5,719,750 A * 2/1998 Iwane
5,786,630 A * 7/1998 Bhansali et al. ..... 257/697
5,796,587 A * 8/1998 Lauffer et al. ..... 174/250
5,912,809 A * 6/1999 Steigerwald et al. ..... 361/780
6,191,475 B1 * 2/2001 Skinner et al.
6,261,467 B1 * 7/2001 Giri et al. ..... 216/13

* cited by examiner

*Primary Examiner*—Ishwar (I. B.) Patel
(74) *Attorney, Agent, or Firm*—Merchant & Gould P.C.

(57) ABSTRACT

A multi-layer circuit board includes first, second, third, fourth, fifth, sixth and seventh insulating substrates disposed sequentially one above the other; first, second, third and fourth signal wiring layers; first, second and third ground wiring layers; and a power wiring layer. Each of the first and seventh insulating substrates has a thickness ranging from 2.5 to 7.5 mil. Each of the second and sixth insulating substrates has a thickness ranging from 3 to 13 mil. Each of the third and fifth insulating substrates has a thickness ranging from 3 to 15 mil. The fourth insulating substrate has a thickness ranging from 2 to 6 mil. The first signal wiring layer has a first resistance with respect to the first ground wiring layer. The second signal wiring layer has a second resistance with respect to the first and second ground wiring layers. The third signal wiring layer has a third resistance with respect to the third ground wiring layer and the power wiring layer. The fourth signal wiring layer has a fourth resistance with respect to the third ground wiring layer. The first, second, third and fourth resistances are within the range of 49.5 to 60.5 ohms.

18 Claims, 5 Drawing Sheets

MULTI-LAYER CIRCUIT BOARD

Matter enclosed in heavy brackets [ ] appears in the original patent but forms no part of this reissue specification; matter printed in italics indicates the additions made by reissue.

BACKGROUND OF THE INVENTION

1. Field of the Invention

The invention relates to a multi-layer circuit board, more particularly to a multi-layer circuit board which can achieve impedance matching to result in reduced high speed signal reflection and reduced electromagnetic interference.

2. Description of the Related Art

A conventional multi-layer circuit board with eight wiring layers generally has a thickness of 1.6 mm or 1.2 mm. Reference is made to FIG. 1, which shows a multi-layer circuit board with a thickness of 1.2 mm. As shown, the circuit board includes: first, second, third, fourth, fifth, sixth and seventh insulating substrates (F1), (F2), (F3), (F4), (F5), (F6), (F7) disposed sequentially one above the other; a first signal wiring layer (S1) disposed on one side of the first insulating substrate (F1) opposite to the second insulating substrate (F2); a first ground wiring layer (GND1) disposed between the first and second insulating substrates (F1), (F2); a second signal wiring layer (S2) disposed between the second and third insulating substrates (F2), (F3); a second ground wiring layer (GND2) disposed between the third and fourth insulating substrates (F3), (F4); a power wiring layer (POWER) disposed between the fourth and fifth insulating substrates (F4), (F5); a third signal wiring layer (S3) disposed between the fifth and sixth insulating substrates (F5), (F6); a third ground wiring layer (GND3) disposed between the sixth and seventh insulating substrates (F6), (F7); and a fourth signal wiring layer (S4) disposed on one side of the seventh insulating substrate (F7) opposite to the sixth insulating substrate (F6). The first, second, third, fourth, fifth, sixth and seventh insulating substrates (F1), (F2), (F3), (F4), (F5), (F6), (F7), the first, second, third and fourth signal wiring layers (S1), (S2), (S3), (S4), the first, second and third ground wiring layers (GND1), (GND2), (GND3), and the power wiring layer (POWER) are press-bonded to each other to form the circuit board with a thickness of about 1.2 mm. The first and fourth signal wiring layers (S1), (S4) are adapted to be mounted with electronic components (not shown) thereon.

Each of the first and seventh insulating substrates (F1), (F7) has a thickness (H4) of about 2.5 mil. Each of the second, fourth and sixth insulating substrates (F2), (F4), (F6) has a thickness (H3), (H1) of about 8 mil. Each of the third and fifth insulating substrates (F3), (F5) has a thickness (H2) of about 5 mil. Each of the first, third, fifth and seventh insulating substrates (F1), (F3), (F5), (F7) is made from a polyester prepreg. Each of the second, fourth and sixth insulating substrates (F2), (F4), (F6) is made from a fibrous core material that contains paper or glass fibers. In this structure, the first signal wiring layer (S1) has a first resistance (Rs1) with respect to the first ground wiring layer (GND1). The second signal wiring layer (S2) has a second resistance (Rs2) with respect to the first and second ground wiring layers (GND1), (GND2). The third signal wiring layer (S3) has a third resistance (Rs3) with respect to the third ground wiring layer (GND3) and the power wiring layer (POWER). The fourth signal wiring layer (S4) has a fourth resistance (Rs4) with respect to the third ground wiring layer (GND3). The first and fourth resistance (Rs1), (Rs4) are about 44 ohms. The second and third resistances (Rs2), (Rs3) are about 55 ohms.

FIG. 2 shows a multi-layer circuit board with a thickness of 1.6 mm. The 1.6 mm circuit board differs from the aforementioned 1.2 mm circuit board in that the thickness (H4) of the first and seventh insulating substrates (F1), (F7) is about 9.5 mil. As a result, the first and fourth resistances (Rs1), (Rs4) are about 76.4 ohms, and the second and third resistances (Rs2), (Rs3) are about 51 ohms. Due to their construction, the conventional circuit boards shown in FIGS. 1 and 2 suffer from the following drawbacks:

1. Serious High Speed Signal Reflection

According to the standard theoretical values determined by Intel, the resistance between two adjacent wiring layers for a circuit board during high speed signal transmission is preferably within the range of 55±10% Ω, i.e., between 49.5 Ω and 60.5 Ω. However, the value of the first and fourth resistance (Rs1), (Rs4) of the aforementioned conventional 1.2 mm circuit board falls outside the preferred range recommended by Intel, and there is additionally a difference of about 11 ohms between the value of the first and fourth resistances (Rs1), (Rs4) and that of the second and third resistances (Rs2), (Rs3). Such a difference will result in an impedance mismatch. Thus, when a high speed signal is being transmitted through the conventional 1.2 mm circuit board and passes from the first or fourth wiring layer (S1) or (S4) to the second or third wiring layer (S2) or (S3) reflection of the signal will result, thereby adversely affecting signal transmission. Likewise, the value of the first and fourth resistances (Rs1), (Rs4) of the aforementioned conventional 1.6 mm circuit board falls outside the theoretical range, and there is a large difference of 25.4 ohms between the value of the first and fourth resistances (Rs1), (Rs4) and that of the second and third resistances (Rs2), (Rs3). The signal reflection problem is therefore very serious. The reflection index of high-speed signals for the 1.2 mm circuit board can be calculated as follows:

$$\rho = \frac{Zl - Zo}{Zl + Zo} = \frac{Rs1 - Rs2}{Rs1 + Rs2} = 0.111$$

The reflection index for the 1.6 mm circuit board can be calculated in a similar manner to result in 0.199.

(2)Weakened magnetic flux counteraction: As reflection of high speed signals will generate standing waves, which will increase electromagnetic radiation of the high speed signals, the magnetic flux counteraction of the circuit board is weakened, thereby resulting in excessively high electromagnetic interference.

SUMMARY OF THE INVENTION

Therefore, the main object of the present invention is to provide a multi-layer circuit board which can achieve impedance matching to result in reduced high speed signal reflection and reduced electromagnetic interference.

Accordingly, a multi-layer circuit board of the present invention includes: first, second, third, fourth, fifth, sixth and seventh insulating substrates disposed sequentially one above the other; a first signal wiring layer disposed on one side of the first insulating substrate opposite to the second insulating substrate; a first ground wiring layer disposed between the first and second insulating substrates; a second signal wiring layer disposed between the second and third insulating substrates; a second ground wiring layer disposed between the third and fourth insulating substrates; a power wiring layer disposed between the fourth and fifth insulating substrates; a third signal wiring layer disposed between the fifth and sixth insulating substrates; a third ground wiring layer disposed between the sixth and seventh insulating substrates; and a fourth signal wiring layer disposed on one side of the seventh insulating substrate opposite to the sixth insulating substrate. Each of the first and seventh insulating substrates has a thickness ranging from 2.5 to 7.5 mil. Each of the second and sixth insulating substrates has a thickness ranging from 3 to 13 mil. Each of the third and fifth insulating substrates has a thickness ranging from 3 to 15 mil. The fourth insulating substrate has a thickness ranging from 2 to 6 mil. The first signal wiring layer has a first resistance with respect to the first ground wiring layer. The second signal wiring layer has a second resistance with respect to the first and second ground wiring layers. The third signal wiring layer has a third resistance with respect to the third ground wiring layer and the power wiring layer. The fourth signal wiring layer has a fourth resistance with respect to the third ground wiring layer. The first, second, third and fourth resistances are within the range of 49.5 to 60.5 ohms.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
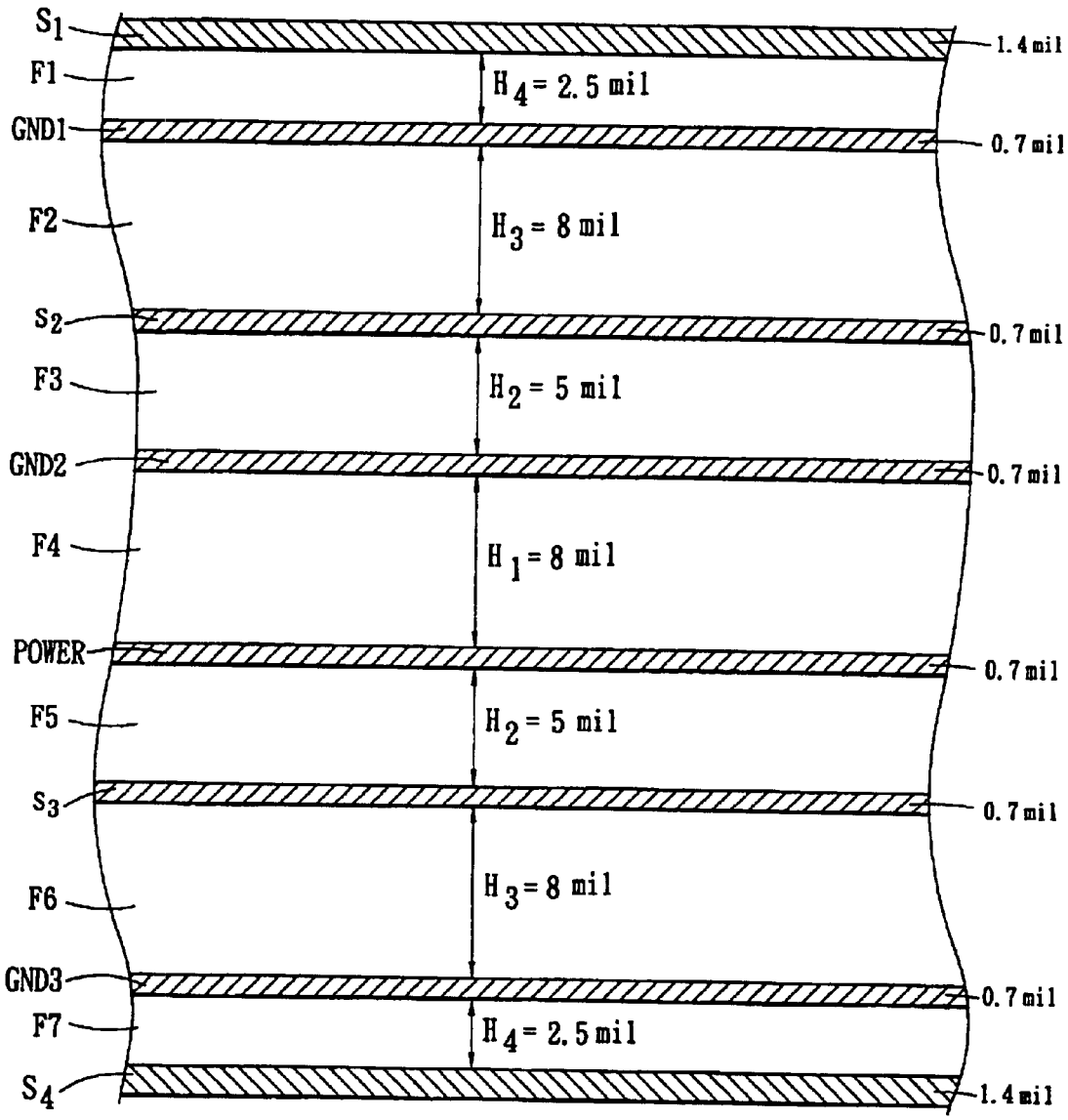
FIG. 1 PRIOR ART
FIG. 1 is a schematic view of a conventional multi-layer circuit board with a thickness of about 1.2 mm.
Figure 2:
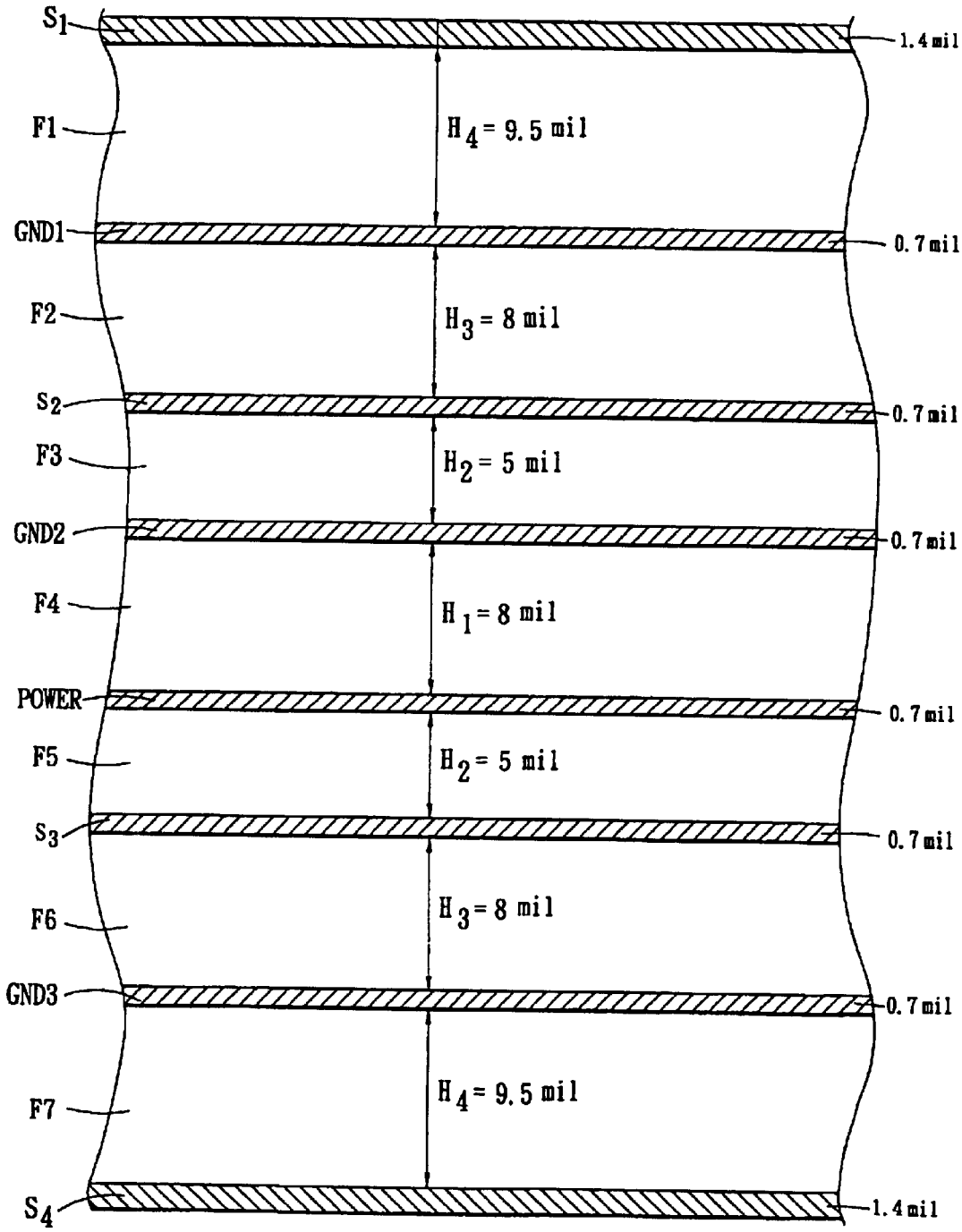
FIG.2 PRIOR ART
FIG. 2 is a schematic view of another conventional multi-layer circuit board with a thickness of about 1.6 mm.

Before the present invention is described in greater detail, it should be noted that like elements are denoted by the same reference numerals throughout the disclosure.

Figure 3:
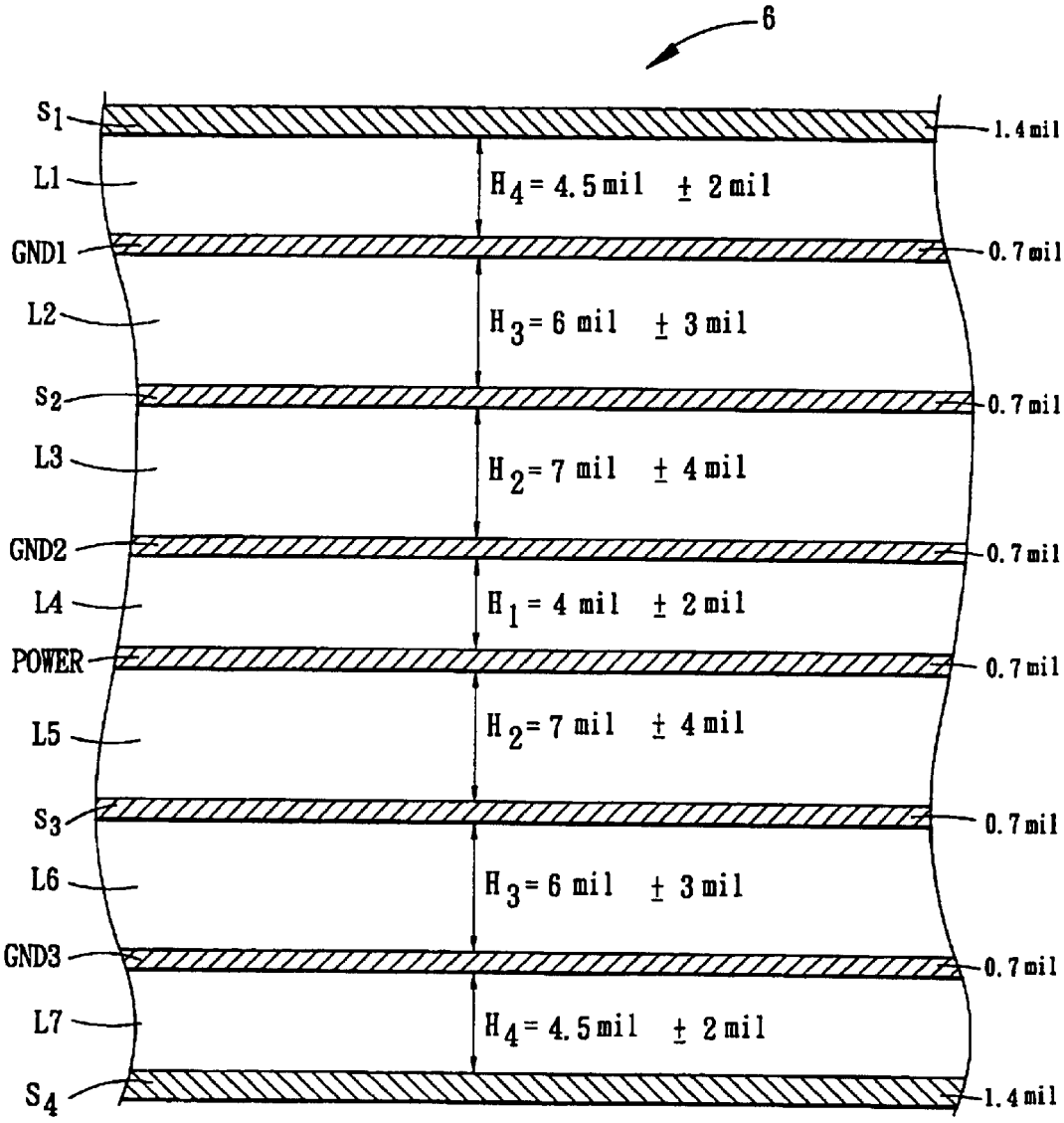
FIG. 3 is a schematic view of the first preferred embodiment of a multi-layer circuit board with a thickness of about 1.2 mm according to the present invention.
Figure 4:
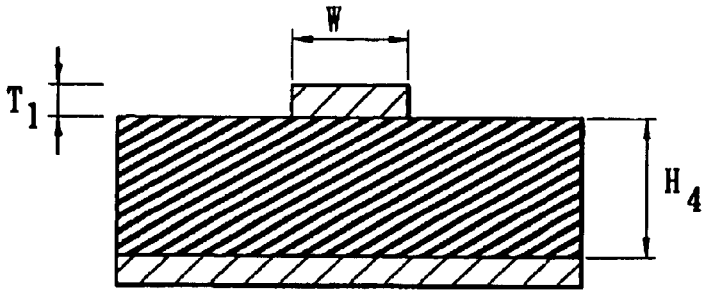
FIG. 4 is sectional view of the first preferred embodiment in part.
Figure 5:
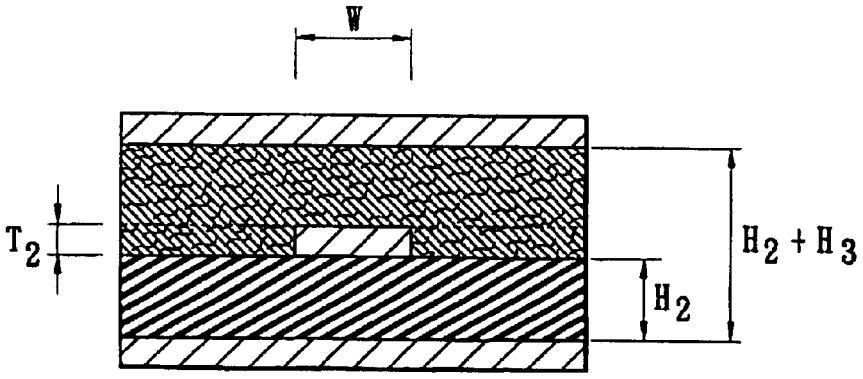
FIG. 5 is another sectional view of the first preferred embodiment in part.

Referring to FIGS. 3 to 5, the first preferred embodiment of a multi-layer circuit board 6 according to the present invention is shown to include first, second, third, fourth, fifth, sixth and seventh insulating substrates (L1), (L2), (L3), (L4), (L5), (L6), (L7) disposed sequentially one above the other; a first signal wiring layer (S1) disposed on one side of the first insulating substrate (L1) opposite to the second insulating substrate (L2); a first ground wiring layer (GND1) disposed between the first and second insulating substrates (L1), (L2); a second signal wiring layer (S2) disposed between the second and third insulating substrates (L2), (L3); a second ground wiring layer (GND2) disposed between the third and fourth insulating substrates (L3), (L4); a power wiring layer (POWER) disposed between the fourth and fifth insulating substrates (L4), (L5); a third signal wiring layer (S3) disposed between the fifth and sixth insulating substrates (L5), (L6); a third ground wiring layer (GND3) disposed between the sixth and seventh insulating substrates (L6), (L7); and a fourth signal wiring layer (S4) disposed on one side of the seventh insulating substrate (L7) opposite to the sixth insulating substrate (L6). The first, second, third and fourth signal wiring layers (S1), (S2), (S3), (S4) are generally made from copper foil, and the first and fourth signal wiring layers (S1), (S4) are adapted to be mounted with electronic components (not shown) thereon.

The first, second, third, fourth, fifth, sixth and seventh insulating substrates (L1), (L2), (L3), (L4) (L5), (L6), (L7), the first, second, third and fourth signal wiring layers (S1), (S2), (S3), (S4), the first, second and third ground wiring layers (GND1), (GND2), (GND3), and the power wiring layer (POWER) are press-bonded to each other to form the circuit board 6 with a thickness of about 1.2 mm.

During press-bonding of the circuit board 6, the second ground wiring layer (GND2) and the power wiring layer (POWER) are disposed to sandwich the fourth insulating substrate (L4). Then, the second signal wiring layer (S2) and the second ground wiring layer (GND2), and the third signal wiring layer (S3) and the power wiring layer (POWER) are disposed to sandwich the third and fifth insulating substrates (L3), (L5), respectively. The first ground wiring layer (GND1) and the second signal wiring layer (S2), and the third ground wiring layer (GND3) and the third signal wiring layer (S3) are disposed to sandwich the second and sixth insulating substrates (L2), (L6). Finally, the first signal wiring layer (S1) and the first ground wiring layer (GND1), and the fourth signal wiring layer (S4) and the third ground wiring layer (GND3) are disposed to sandwich the first and seventh insulating substrates (L1), (L7) to constitute the 1.2 mm multi-layer circuit board 6.

According to the present invention, each of the first and seventh insulating substrates (L1), (L7) has a thickness (H4) ranging from 2.5 to 7.5 mil. Each of the second and sixth insulating substrates (L2), (L6) has a thickness (H3) ranging from 3 to 13 mil. Each of the third and fifth insulating substrates (L3), (L5) has a thickness (H2) ranging from 3 to 15 mil. The fourth insulating substrate (L4) has a thickness (H1) ranging from 2 to 6 mil. The first signal wiring layer (S1) has a first resistance (Rs1) with respect to the first ground wiring layer (GND1). The second signal wiring layer (S2) has a second resistance (Rs2) with respect to the first and second ground wiring layers (GND1), (GND2). The third signal wiring layer (S3) has a third resistance (Rs3) with respect to the third ground wiring layer (GND3) and the power wiring layer (POWER). The fourth signal wiring layer (S4) has a fourth resistance (Rs4) with respect to the third ground wiring layer (GND3). With the thicknesses of the insulating substrate (L1), (L2), (L3), (L4), (L5) (L6), (L7) controlled to be within the aforementioned ranges, the first, second, third and fourth resistances (Rs1), (Rs2), (Rs3), (Rs4) can be kept within the range of 49.5 to 60.5 ohms recommended by Intel for high speed signal transmission so as to achieve impedance matching.

At least one of the first, third, fifth and seventh insulating substrates (L1), (L3), (L5), (L7) is made from a polyester prepreg. At least one of the second, fourth and sixth insulating substrates (L2), (L4), (L6) is made from a fibrous core material that contains paper fibers or glass fibers.

According to the first preferred embodiment, each of the first and fourth signal wiring layers (S1), (S4) has a thickness of about 1.4 mil. Each of the second and third signal wiring layers (S2), (S3), the first, second and third ground wiring layers (GND1), (GND2), (GND3), and the power wiring layer (POWER) has a thickness of about 0.7 mil. Each of the first and seventh insulating substrates (L1), (L7)

has a preferred thickness (H4) of 4.5±2 mil, more preferably 4.5 mil. Each of the second and sixth insulating substrates (L2), (L6) has a preferred thickness (H3) of 6±3 mil, more preferably 6 mil. Each of the third and fifth insulating substrates (L3), (L5) has a preferred thickness (H2) of 7±4 mil, more preferably 7 mil. The fourth insulating substrate (L4) has a preferred thickness (H1) of 4 mil. Preferably, the thicknesses (H4) of the first and seventh insulating substrates (L1), (L7) are equal. The thicknesses (H3) of the second and sixth insulating substrates (L2), (L6) are equal. The thicknesses (H2) of the third and fifth insulating substrates (L3), (L5) are equal.

The calculation of the approximate thickness of each of the insulating substrates (L1), (L2), (L3), (L4) (L5), (L6) and (L7) is explained in the following description.

Firstly, the value of the first resistance and fourth resistance (Rs1), (Rs4) is calculated using the following Formula (1):

$$Rs1 = Rs4 = \frac{87}{\sqrt{E_R + 1.41}} \ln\left\{\frac{5.98H4}{0.8W + T1}\right\} \quad 1$$

wherein $E_R$ is the dielectric coefficient and is equal to 4.5; H4 is the thickness of the first and seventh insulating substrates (L1), (L7); W is the width of traces of the first and forth signal wiring layers (S1), (S4) and is within the range of 2 to 8 mil and is equal to 5 mil in this preferred embodiment; and T1 is the thickness of the first and fourth signal wiring layers (S1), (S4) and is equal to 1.4 mil.

Next, the value of the second and third resistances (Rs2), (Rs3) is obtained using the following Formula (2):

$$Rs2 = Rs3 = \frac{60}{\sqrt{E_R}} \ln\left\{\frac{4(H3 + H2)}{0.67\pi W\left(0.8 + \frac{T2}{W}\right)}\right\} \quad 2$$

wherein $E_R$ is the dielectric coefficient and is equal to 4.5; H2 is the thickness of the third and fifth insulating substrates (L3), (L5); H3 is the thickness of the second and sixth insulating substrates (L2), (L6); T2 is the thickness of the second and third signal wiring layers (S2), (S3) and is equal to 0.7 mil; and W is the width of traces of the second and third signal wiring layers (S2), (S3) and is within the range of 2 to 8 mil. In this preferred embodiment, W is equal to 5 mil.

$$2H4+2H3+2H2+1H1+2T1+6T2=1.2 \text{ mm} \quad . . . 3$$

In addition, the total thickness of the circuit board should be equal to 1.2 mm (equivalent to about 47 mil) or within a tolerance range thereof, as expressed by the Formula (3). Based on the above Formula (3), the preferred value of thickness of each of the insulating substrates can be obtained. That is, when H1, the thickness of the fourth insulating substrate (L4) is within the range of 2 to 6 mil, it is preferably equal to 4 mil. When H2, the thickness of each of the third and fifth insulating substrates (L3), (L5) is within the range of 3 to 11 mil, it is preferably equal to 7 mil. When H3, the thickness of the second and sixth insulating substrates (L2), (L6) is within the range of 3 to 9 mil, it is preferably equal to 6 mil. When H4, the thickness of each of the first and seventh insulating substrates (L1), (L7) is within the range of 2.5 to 6.5 mil, it is preferably equal to 4.5 mil. As such, the first resistance (Rs1) of the first signal wiring layer (S1) with respect to the first ground wiring layer (GND1) is equal to the fourth resistance (Rs4) of the fourth signal wiring layer (S4) with respect to the third ground wiring layer (GND3) and is equal to 58 ohms, i.e., Rs1=Rs4=58 Ω. The second resistance (Rs2) of the second signal wiring layer (S2) with respect to the first and second ground wiring layers (GND1), (GND2) is equal to the third resistance (Rs3) of the third signal wiring layer (S3) with respect to the power wiring layer (POWER) and the third ground wiring layer (GND3) and is equal to 52 ohms, i.e., Rs2=Rs3=52 Ω. It is noted that these resistance values fall within the theoretical range of 55 Ω±10%, and have a difference of only 6 ohms. As such, the reflection index ρ is reduced to 0.05, which is lower than the reflection index (ρ=0.11) in the prior art. Besides, the total thickness of the circuit board 6 fulfills Formula 3 (2H4+2H3+2H2+1H1+2T1+6T2), and is equal to 2×4.5 mil+2×6 mil+2×7 mil+1×4 mil+2×1.4 mil+6×0.7 mil=46 mil≈1.2 mm (within tolerance range).

Figure 6:
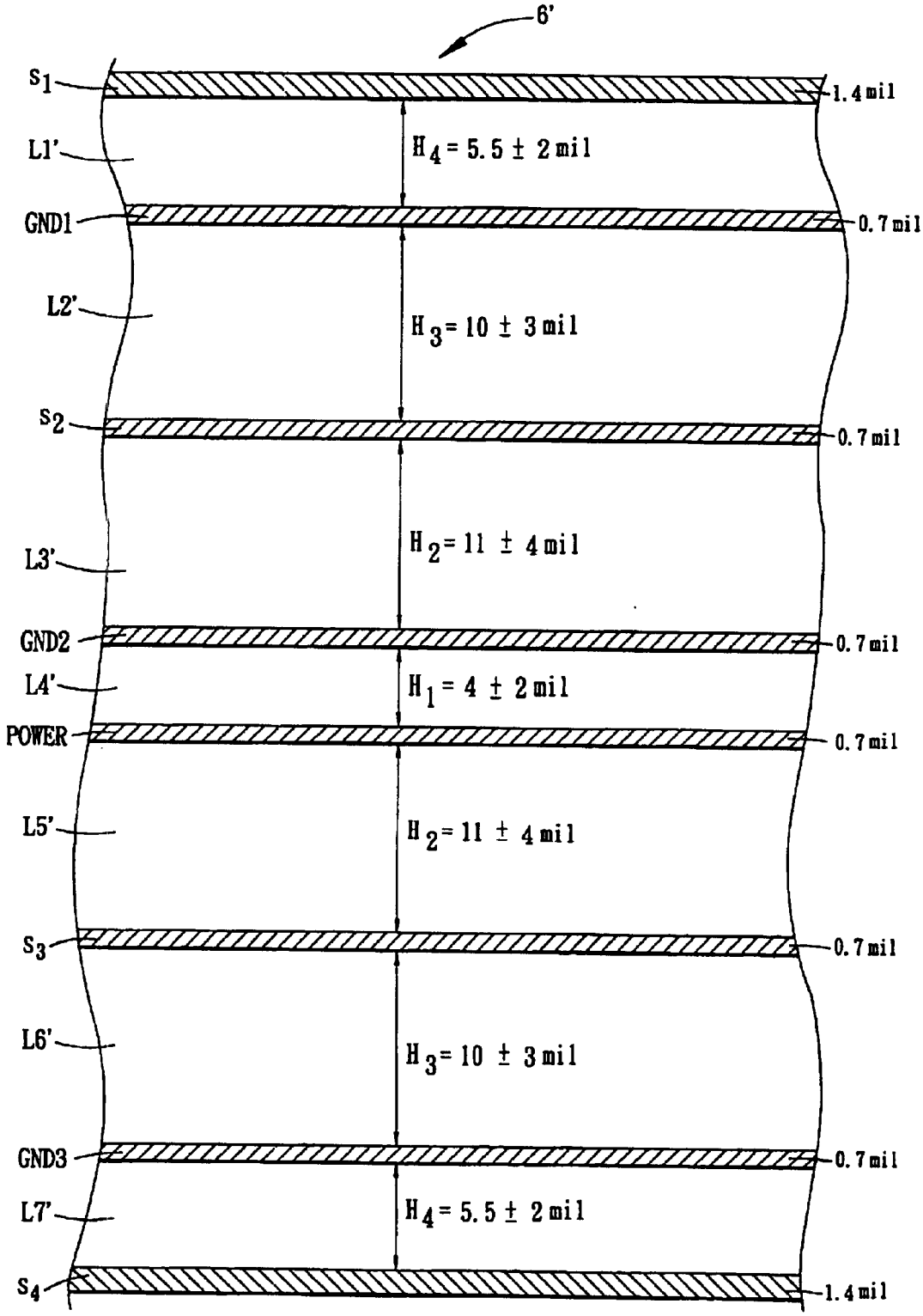
FIG. 6 is a schematic view of the second preferred embodiment of a multi-layer circuit board with a thickness of about 1.6 mm according to the present invention.

FIG. 6 shows the second preferred embodiment of a multi-layer circuit board 6' according to the present invention. The difference between this embodiment and the previous embodiment is that the circuit board 6' has a thickness of about 1.6 mm, that each of the first and seventh substrates (L1'), (L7') has a preferred thickness of 5.5±2 mil, more preferably 5.5 mil, that each of the second and sixth insulating substrates (L2'), (L6') has a preferred thickness of 10±3 mil, more preferably 10 mil, and that each of the third and fifth insulating substrates (L3'), (L5') has a preferred thickness of 11±4 mil, more preferably 11 mil. The first signal wiring layer (S1) has a first resistance (Rs1') with respect to the first ground wiring layer (GND1). The second signal wiring layer (S2) has a second resistance (Rs2') with respect to the first and second ground wiring layers (GND1), (GND2) The third signal wiring layer (S3) has a third resistance (Rs3') with respect to the third ground wiring layer (GND3) and the power wiring layer (POWER) The fourth signal wiring layer (S4) has a fourth resistance (Rs4') with respect to the third ground wiring layer (GND3).

Under the condition that the sum according to Formula (3) is substantially equal to 1.6 mm (approximately 64 mil) and that the resistance values fall within the theoretical range recommended by Intel, the value of (Rs1'), (Rs4') and the value of (Rs2'), (Rs3') are first calculated using Formulae (1) and (2) so as to obtain the preferred thickness of each of the insulating substrates. Of these parameters, the width of traces of the signal wiring layers is within the range of 2 to 8 mil, and is preferably 6 mil, as is mostly adopted for 1.6 mm circuit boards. It is found that when H1 is within the range of 2 to 6 mil, H1 is preferably 4 mil. When H2 is within the range of 7 to 15 mil, H2 is preferably 11 mil. When H3 is within the range of 7 to 13 mil, H3 is preferably 10 mil. When H4 is within the range of 3.5 to 7.5 mil, H4 is preferably 5.5 mil. As such, the first resistance (Rs1') is equal to the fourth resistance (Rs4') and is equal to 60 ohms, i.e., (Rs1')=(Rs4')=60 Ω. The second resistance (Rs2') is equal to the third resistance (Rs3') and is equal to 60 ohms, i.e., (Rs2')=(Rs3')=60 Ω. Both of these resistance values fall within the range of 49.5 to 60.5 ohms recommended by Intel. Besides, the reflection index is reduced to zero. Moreover, the thickness of the circuit board 6' according to Formula (3) is substantially equal to 1.6 mm: 2H4+2H3+2H2+1H1+2T1+6T2=2×5.5 mil+2×10 mil+1×4 mil+2×1.4 mil+6×0.7 mil=64 mil≈1.6 mm (within tolerance range).

Accordingly, the multi-layer circuit board of the present invention has the following advantages:

1. Reduced High Speed Signal Reflection

Since the resistances in both of the first and second preferred embodiments fall within the recommended range of 55±10%, and since the reflection indexes are substantially low as compared to those in the prior art, reflection of high speed signals can: be significantly reduced or eliminated to make the circuit board very suitable for high speed signal transmission.

2. Reduced Electromagnetic Interference

As a result of reduced high speed signal reflection, generation of standing waves is not likely. Hence, magnetic flux counteraction can be enhanced to reduce electromagnetic interference to meet current EMI standards.

3. Better Adaptability for High Speed Signal Layout

In view of the aforementioned advantages, the circuit board of this invention is suited for high speed signal layout to meet the current trend in the industry toward high speed signal development and to enhance market value of products and market competitiveness.

4. Enhanced Layout Time Efficiency

Due to impedance matching, there is no need to alter the width of traces of the signal wiring layers, thereby improving the layout time efficiency.

While the present invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

I claim:

1. A multi-layer circuit board comprising:

first, second, third, fourth, fifth, sixth and seventh insulating substrates disposed sequentially one above the other;

a first signal wiring layer disposed on one side of said first insulating substrate opposite to said second insulating substrate;

a first ground wiring layer disposed between said first and second insulating substrates;

a second signal wiring layer disposed between said second and third insulating substrates;

a second ground wiring layer disposed between said third and fourth insulating substrates;

a power wiring layer disposed between said fourth and fifth insulating substrates;

a third signal wiring layer disposed between said fifth and sixth insulating substrates;

a third ground wiring layer disposed between said sixth and seventh insulating substrates; and a fourth signal wiring layer disposed on one side of said seventh insulating substrate opposite to said sixth insulating substrate;

wherein each of said first and seventh insulating substrates has a thickness ranging from 2.5 to 7.5 mil;

wherein each of said second and sixth insulating substrates has a thickness ranging from 3 to 13 mil;

wherein each of said third and fifth insulating substrates has a thickness ranging from 3 to 15 mil;

wherein said fourth insulating substrate has a thickness ranging from 2 to 6 mil;

wherein said first signal wiring layer has a first resistance with respect to said first ground wiring layer, said second signal wiring layer having a second resistance with respect to said first and second ground wiring layers, said third signal wiring layer having a third resistance with respect to said third ground wiring layer and said power wiring layer, said fourth signal wiring layer having a fourth resistance with respect to said third ground wiring layer; and wherein said first, second, third and fourth resistances are within the range of 49.5 to 60.5 ohms.

2. The multi-layer circuit board of claim 1, wherein at least one of said first, third, fifth and seventh insulating substrates is made from a polyester prepreg.

3. The multi-layer circuit board of claim 1, wherein at least one of said second, fourth and sixth insulating substrates is made from a fibrous core material.

4. The multi-layer circuit board of claim 3, wherein the core material contains paper fibers.

5. The multi-layer circuit board of claim 3, wherein the core material contains glass fibers.

6. The multi-layer circuit board of claim 1, wherein the thicknesses of said first and seventh insulating substrates are equal.

7. The multi-layer circuit board of claim 1, wherein the thicknesses of said second and sixth insulating substrates are equal.

8. The multi-layer circuit board of claim 1, wherein the thicknesses of said third and fifth insulating substrates are equal.

9. The multi-layer circuit board of claim 1, wherein:

each of said first and fourth signal wiring layers has a thickness of about 1.4 mil; and each of said second and third signal wiring layers, said first, second and third ground wiring layers, and said power wiring layer has a thickness of about 0.7 mil.

10. The multi-layer circuit board of claim 1, wherein:

each of said first and seventh insulating substrates has a thickness of 4.5±2 mil;

each of said second and sixth insulating substrates has a thickness of 6±3 mil;

each of said third and fifth insulating substrates has a thickness of 7±4 mil; and said first, second, third, fourth, fifth, sixth and seventh insulating substrates, said first, second, third and fourth signal wiring layers, said first, second and third ground wiring layers, and said power wiring layer are press-bonded to each other to form said circuit board with a thickness of about 1.2 mm.

11. The multi-layer circuit board of claim 10, wherein:

each of said first and seventh insulating substrates has a thickness of 4.5 mil;

each of said second and sixth insulating substrates has a thickness of 6 mil;

each of said third and fifth insulating substrates has a thickness of 7 mil; and said fourth insulating substrate has a thickness of 4 mil.

12. The multi-layer circuit board of claim 1, wherein:

each of said first and seventh insulating substrates has a thickness of 5.5±2 mil;

each of said second and sixth insulating substrates has a thickness of 10±3 mil;

each of said third and fifth insulating substrates has a thickness of 11±4 mil; and said first, second, third, fourth, fifth, sixth and seventh insulating substrates, said first, second, third and fourth signal wiring layers, said first, second and third ground wiring layers, and said power wiring layer are press-bonded to each other to form said circuit board with a thickness of about 1.6 mm.

13. The multi-layer circuit board of claim 12, wherein:

each of said first and seventh insulating substrates has a thickness of 5.5 mil;

each of said second and sixth insulating substrates has a thickness of 10 mil;

each of said third and fifth insulating substrates has a thickness of 11 mil; and said fourth insulating substrate has a thickness of 4 mil.

*14. A multi-layer circuit board comprising:*

*first, second, third, fourth, fifth, sixth and seventh insulating substrates disposed sequentially one above the other;*

*a first signal wiring layer disposed on one side of said first insulating substrate opposite to said second insulating substrate;*

*a first wiring layer disposed between said first and second insulating substrates;*

*a second signal wiring layer disposed between said second and third insulating substrates;*

*a second wiring layer disposed between said third and fourth insulating substrates;*

*a third wiring layer disposed between said fourth and fifth insulating substrates;*

*a third signal wiring layer disposed between said fifth and sixth insulating substrates;*

*a fourth wiring layer disposed between said sixth and seventh insulating substrates; and*

*a fourth signal wiring layer disposed on one side of said seventh insulating substrate opposite to said sixth insulating substrate;*

*wherein each of said first and seventh insulating substrates has a thickness ranging from 2.5 to 7.5 mil;*

*wherein each of said second and sixth insulating substrates has a thickness ranging from 3 to 13 mil;*

*wherein each of said third and fifth insulating substrates has a thickness ranging from 3 to 15 mil;*

*wherein a signal trace of said first signal wiring layer has a first resistance with respect to said first wiring layer, a signal trace of said second signal wiring layer having a second resistance with respect to said first and second wiring layers, a signal trace of said third signal wiring layer having a third resistance with respect to said third and fourth wiring layers, a signal trace of said fourth signal wiring layer having a fourth resistance with respect to said fourth wiring layer; and*

*wherein said first, second, third and fourth resistances are within the range of 49.5 to 60.5 ohms.*

*15. The multi-layer circuit board of claim 14, wherein said first, second, third, and fourth wiring layers are a first ground wiring layer, a second ground wiring layer, a power wiring layer, and a third ground wiring layer, respectively.*

*16. The multi-layer circuit board of claim 14, wherein said fourth insulating substrate has a thickness ranging from 2 to 6 mil.*

*17. The multi-layer circuit board of claim 14, wherein one of said first, second, third, and fourth wiring layers is a ground wiring layer.*

*18. The multi-layer circuit board of claim 14, wherein one of said first, second, third, and fourth wiring layers is a power wiring layer.*

* * * * *

UNITED STATES PATENT AND TRADEMARK OFFICE

CERTIFICATE OF CORRECTION

PATENT NO. : RE 39,766 E
APPLICATION NO. : 10/943256
DATED : August 14, 2007
INVENTOR(S) : Yu-Chiang Cheng It is certified that error appears in the above-identified patent and that said Letters Patent is hereby corrected as shown below:

Title Page:

Item (73) Assignee: Mitac Technology Corp. Hsin-Chu Hsien (TW) should read

Mitac International Corp. Hsin-Chu Hsien (TW)

Signed and Sealed this

Twenty-seventh Day of April, 2010

David J. Kappos

David J. Kappos
*Director of the United States Patent and Trademark Office*